(12) United States Patent
Beck

(10) Patent No.: US 6,897,707 B2
(45) Date of Patent: May 24, 2005

(54) ISOLATED FET DRIVE UTILIZING ZENER DIODE BASED SYSTEMS, METHODS AND APPARATUS

(75) Inventor: Martin E. Beck, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/459,332

(22) Filed: Jun. 11, 2003

(65) Prior Publication Data

US 2004/0251951 A1 Dec. 16, 2004

(51) Int. Cl.[7] .......................................... H03K 17/687
(52) U.S. Cl. ...................... 327/427; 327/112; 327/502
(58) Field of Search ................. 327/108–112, 427–430, 327/434, 389, 372, 374, 376, 377, 379–381, 502, 584

(56) References Cited

U.S. PATENT DOCUMENTS

| | | | | |
|---|---|---|---|---|
| 3,828,208 A | * | 8/1974 | Kelleher ...................... | 327/109 |
| 4,777,386 A | * | 10/1988 | Majumdar .................. | 327/109 |
| 4,937,470 A | * | 6/1990 | Zeiler .......................... | 327/109 |
| 5,115,143 A | * | 5/1992 | Rohulich et al. ........... | 327/109 |
| 5,276,357 A | * | 1/1994 | Cripe .......................... | 327/109 |
| 5,774,000 A | * | 6/1998 | Vercellotti et al. .......... | 327/110 |
| 5,777,496 A | * | 7/1998 | Herman ...................... | 327/108 |
| 5,828,244 A | * | 10/1998 | Palara et al. ................. | 327/108 |
| 5,939,927 A | * | 8/1999 | Myers ......................... | 327/390 |
| 6,021,053 A | * | 2/2000 | Baskette et al. .............. | 363/40 |
| 6,172,383 B1 | * | 1/2001 | Williams ..................... | 257/173 |
| 6,175,256 B1 | * | 1/2001 | Miettinen .................... | 327/108 |

* cited by examiner

*Primary Examiner*—Timothy P. Callahan
*Assistant Examiner*—Hai L. Nguyen
(74) *Attorney, Agent, or Firm*—Amin & Turocy, LLP

(57) ABSTRACT

The present invention provides a system, apparatus and methodology for semiconductor device gate control utilizing a gate driver circuit 112 having opposing current inhibiting elements 130, 132 capable of controlling current flow until a predetermined voltage level is obtained across the current inhibiting element opposing the current flow. A difference of an isolated input voltage level and the predetermined voltage level approximates a gate voltage potential employed to drive a gate input of a semiconductor device. This is accomplished, in one instance of the present invention, by employing Zener diodes in an opposing fashion to produce the gate voltage potential. Zener diode breakdown voltages provide the predetermined voltage levels necessary to properly control the gated semiconductor device during gate charge and discharge cycles.

25 Claims, 9 Drawing Sheets

ISOLATED FET DRIVE UTILIZING ZENER DIODE BASED SYSTEMS, METHODS AND APPARATUS

BACKGROUND OF THE INVENTION

1. Field of the Invention

The present invention relates to a system, apparatus and methodology for semiconductor device control, and in particular to controlling semiconductor devices utilizing an isolated FET drive based on Zener diodes.

2. Discussion of the Related Art

Semiconductors have permeated into every aspect of modern society. They are the building blocks used to create everything from the information super-highway to the electronic timer in the family toaster. Generally, any device that is considered "electronic" utilizes semiconductors. These often-unseen components help to reduce the daily workload, increase the safety of our air traffic control systems, and even let us know when it is time to add softener to the washing machine. Modern society has come to rely on these devices in almost every product produced today. And, as we progress further into a technologically dependent society, the demand for increased device speeds, capacity and functionality drive semiconductor manufacturers to push the edge of technology even further.

One common type of semiconductor is the transistor. This device revolutionized the electronics industry after its invention in 1947. Prior to this time, circuits requiring amplification of signals were forced to utilize bulky vacuum tubes for this task. Transistors provided signal amplification at less than a tenth the size of vacuum tubes. This led to new portable devices, such as the transistor radio, that before the transistor could not have been transported easily. Big, bulky pieces of equipment were suddenly reduced in size to handy portable units. Thus, the transistor helped to create a new world of electronic devices that could fit and be utilized in ways never before possible, replacing the fragile and cumbersome vacuum tubes.

Transistor technology has progressed steadily since 1947. Many different types of transistors have been developed such as junction transistors, BJT (bipolar junction transistors), FET (field-effect transistors), MOSFET (metal-oxide semiconductor field-effect transistors) and IGBT (insulated gate bipolar transistors). Generally speaking, a transistor is comprised of semiconductor materials that interface with common physical boundaries. The semiconductor materials utilized include gallium-arsenide and germanium which are doped with impurities to make them conductive. An "n-type" semiconductor has excess electrons due to the impurities and a "p-type" semiconductor has a deficiency of electrons, and therefore, an excess of holes. Electrons are negative charge carriers and holes are positive charge carriers.

A junction transistor consists of two outer semiconductors separated by a thin layer of an opposing type of semiconductor material. When the electric potentials on one of the outer layers and the thin layer meet a certain threshold, a small current between the layers occurs. This small current creates a large current between the two outer semiconductor layers, producing current amplification. Junction transistors can be N-P-N or P-N-P. Either type operates in the same fashion, but each operates with different polarities. The transistor can also be employed as a switch.

Another type of transistor is the BJT that is characterized by two back-to-back p-n junctions which share a common base region. It also has carriers that are injected into the base from the emitter by forward biasing the emitter-base junction (normal operation). The base is much shorter than the carrier diffusion length, and the carriers traverse the base to reach the collector.

The FET was developed after the junction transistor and draws virtually no power from an input signal, surmounting a major obstacle of the junction transistor. A FET is comprised of a channel of semiconductor material interposed between two electrodes. The electrodes attached to the ends of the channel are called the source and the drain. The channel contains regions of opposing semiconductor material to that which makes up the electrodes (p-type versus n-type or n-type versus p-type). These regions are in proximity to electrodes called gates. A specific threshold potential applied to the gates impedes current flow between the source and the drain. This is normally referred to as a reverse potential or voltage, Changing the value of this reverse potential alters the resistance of the channel, allowing the reverse potential to regulate the current flow between the source and the drain. Altering the type of composition of the semiconductor material allows for the device to operate with reversed polarities.

Another variation of the FET transistor is the MOSFET. This is a single gate device in which the gate is separated from the channel by a layer of dielectric, typically metal oxide. The gate's electric field penetrates through the dielectric layer and into the channel, controlling the resistance of the current through the channel. A potential applied to the gate of the MOSFET can increase the current flow between the source and the drain and also decrease it.

Another type of transistor is the IGBT which was developed in the early 1980's to overcome some inherent disadvantages of the MOSFET. The IGBT combines advantages of a BJT and MOSFET to produce advantageous characteristics of both types of transistors. A power MOSFET has simple gate control circuitry capability and fast switching, but rapidly increasing "on" resistance as breakdown voltage is increased. The BJT excels in "on" characteristics, but its base control circuitry needs to be complex for proper operation, and it is not as good in fast switching as the MOSFET. The IGBT combines the best of both types creating a MOS gate input structure employing simple input controls with fast switching and a conduction capability superior to a normal BJT.

Because of the similarities in gate type structures for the MOSFET and IGBT, their gate driver circuitry design can be similar, although biasing needs to be stronger in IGBTs due to the large input gate-to-emitter capacitance. Even though MOSFETs/IGBTs are less complicated to drive than BJTs, care must be taken in the drive circuitry design to maximize the performance of these devices, as well as preventing outright device failure. The MOSFET/IGBT is a voltage controlled device with theoretically no current draw on the gate. In reality, however, there is a large non-linear gate charge that must be overcome before the MOSFET/IGBT is able to turn "ON." To achieve maximum performance from the MOSFET/IGBT, large instantaneous currents are required to keep switching times and power losses at a minimum. Additionally, most MOSFETs/IGBTs have a typical 20 volt limit on the gate of the MOSFET/IGBT. The silicon dioxide layer between the gate and the source regions can be easily penetrated, resulting in device failure, if the voltage between the gate and source exceeds 20 volts, even with low current. The performance characteristics of MOSFETs/IGBTs depend on well designed gate driver circuitry to function optimally.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates generally to semiconductor device control, and, in particular, to controlling a gated semiconductor device utilizing an isolated gate driver. By employing the present invention, the semiconductor device is driven with a more advantageous and less complicated gate driver. The present invention facilitates controlling gated semiconductor devices by simplifying both the circuitry and parts required. The subject invention also facilitates the inherent quality of pre-existing circuits by providing better control with less complex, higher dependability parts.

More particularly, the subject invention utilizes opposing current inhibiting elements capable of controlling current flow until a predetermined voltage level is obtained across the current inhibiting element opposing the current flow. A difference of an isolated input voltage level and the predetermined voltage level approximates a gate voltage potential employed to drive a gate input of a semiconductor device. This is accomplished, in one instance of the present invention, by employing Zener diodes in an opposing fashion to produce the gate voltage potential. Zener diode breakdown voltages provide the predetermined voltage levels necessary to properly control the gated semiconductor device during gate charge and discharge cycles. Thus, in accordance with the subject invention, a gate of a semiconductor device, such as a MOSFET and/or IGBT and the like, can be driven by a less complex, higher reliability isolated driver. Since enhanced characteristics are obtained utilizing this type of semiconductor device, the present invention reduces implementation costs, increases quality, and simplifies part complexity.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

Figure 1:
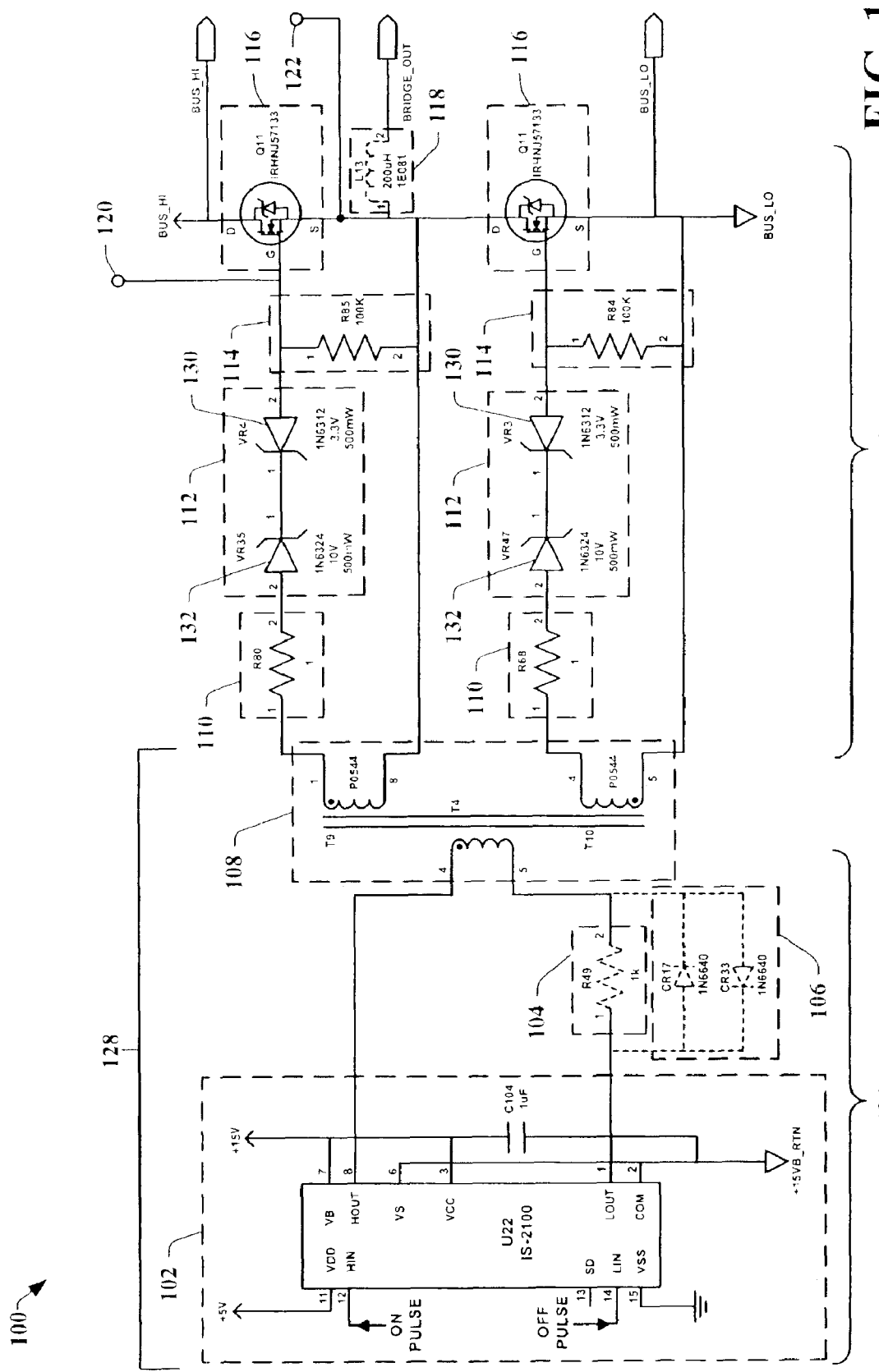
FIG. 1 is a representative circuit of a gate driver in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

A typical isolated gate driver utilizes transistors between a transformer and FETs being driven, which are slow to respond and, thus, make it harder to control any overlap or under-lap. Timing overlap is undesirable because the time both transistors are turned on creates an uncontrolled current spike through the two transistors in a half bridge. Timing underlap is also undesirable because if both transistors are off, a current in an inductive load will go through one of a MOSFET's intrinsic diodes and when a transistor turns on, a large current will flow during a reverse recovery time of the intrinsic diode. (The intrinsic diode is depicted as a Zener diode in MOSFET symbols. It is sometimes called a "body diode.") The present invention provides a near instantaneous response circuit that can achieve a 100% duty cycle. The speed of the present invention also eliminates any need to utilize snubbers in an output voltage stage. Additionally, by employing the present invention, an isolated circuit driver can be constructed utilizing FET drivers in place of pulse width modulation (PWM) circuitry to perform the direct current to direct current (dc to dc) isolation conversion. Zener diodes act to maintain a gate charge even after a typical 500 nsec pulse has ended and a transformer is resetting. Typical PWM circuitry, in designs without current blocking between a transformer and a gate, require transformers large enough to handle the volt-seconds of the entire PWM on time, not just the 500 nsec time period needed to get the gate to turn "ON." Circuitry utilizing the present invention has very low pulse "ON" times (e.g., 500 nsec)

and, thus, utilizes significantly smaller transformers to isolate and transfer power. PWMs require a much larger transformer to perform this function due to its significantly longer "ON" time (e.g., 10 $\mu$S). Therefore, in order to prevent saturation of a transformer core, the same voltage potential will require a transformer approximately 10 times larger for a PWM than for circuitry with the present invention, due to increased volt-second ratings necessitating physically larger transformers. The present invention, in one instance, can provide a primary winding input voltage in a range of approximately 5 to 20 volts while utilizing a transformer with a volt-second rating of less than approximately 15 $\mu$V*S.

In FIG. 1, a representative circuit 100 of a gate driver in accordance with an aspect of the present invention is illustrated. In this instance of the present invention, a half bridge circuit is constructed that can produce a 100% duty cycle, with fewer parts and higher reliability than a typical gate driver circuit. The representative circuit 100 is comprised of a switchable isolated voltage source 128, current limiting elements 110, gate driver circuits 112, gate drain resistive elements 114, output control devices 116, and an optional output filter 118. A gate voltage test point (TP) 120 and an output voltage test point (TP) 122 are also shown.

The switchable isolated voltage source 128 is typically comprised of a switching means such as FET driver 102 and an isolation means such as an isolation device 108. The switchable isolated voltage source 128, however, can also be comprised of other switching means to provide voltage levels of differing orientation. The isolation device 108 in the switchable isolated voltage source 128 can be an isolation transformer and/or any isolated means of transferring energy. In other instances of the present invention, the switchable isolated voltage source 128 can also include an optional primary side resistive element 104 and/or an optional transformer core desaturation circuit 106. The switchable isolated voltage source 128 provides a first input voltage level having a first input orientation and a second input voltage level having a second input orientation for a secondary side 126, supplying the gate driver circuits 112.

The FET driver 102 is typically used as a gate driver. However, in one instance of the present invention, it is employed to enable energy transfer through the isolation device 108. The high and low outputs of the FET driver 102 are connected to the isolation device 108. "ON" and "OFF" pulses trigger a high and a low output of the FET driver 102. In this example, a radiation hardened device is shown; however, a non-hardened device can be employed as well. Additionally, in one instance of the present invention, the low out is connected to the isolation device 108 via the optional transformer core desaturation circuit 106. This circuit 106 gives a voltage value to a primary side 124 of the circuit 100 to reset a transformer's core (as found in typical isolation devices) between pulses. It allows a volt-second reset period equal to the pulse's volt seconds. For example, to reset a core that has been charged with 15V for 500 nsec, it will take approximately 22 times as long through a 0.7V diode. This reset time is not required for duty cycles less than 100% and greater than 0% because "OFF" pulses balance "ON" pulses. It is used to reset the core in cases where 0% and 100% duty cycles are desired. Because of these reset diodes, the circuit 100 can operate over a full range from 0 to 100% duty cycles. Optional primary side resistive element 104 further facilitates resetting a core after a core's voltage is less than a diode voltage drop and is an optional element. Designs requiring even higher PWM frequencies can have two or more diodes in series to get 1.4 volts or more to reset a core even faster. The optional transformer core desaturation circuit 106 can be used to control an isolation device's core saturation level. As a switching frequency increases, desaturation of a core must occur in a decreasing time period. This circuit 106 can include no elements (elimination of circuit 106), diodes, back-to-back diodes, and Zener diodes.

The isolation device 108 is typically a transformer based isolation device. A turns ratio (secondary turns/primary turns) for the transformer can be any value (e.g., 1:1, 2:1, 10:1, etc.). Generally, a primary side winding and a secondary side winding are in phase. However, in another instance of the, present invention, the phases can differ. The transformer can have a core comprised of, for example, air, ferrite, and iron and the like, sufficient to transfer energy from the primary side winding of the transformer to the secondary side winding of the transformer. A low loss type transformer allows for maximum energy transfer. In other instances of the present invention, any isolated means for transferring energy can be utilized.

The current limiting elements 110 are typically low value resistors in an approximate range of 1 to 10 ohms. These current limiting elements 110 limit the amount of current and also lower the noise level of the secondary side 126.

The gate driver circuits 112 are comprised of opposing first and second current inhibiting elements 130, 132. The first current inhibiting element 130 is capable of controlling a first current flow having a first current orientation induced by the first input voltage level until a first predetermined voltage level is obtained across the first current inhibiting element 130 opposing the first current flow. A difference of the first input voltage level and the first predetermined voltage level approximates a first gate voltage potential employed to drive a gate input of a semiconductor device. The second current inhibiting element 132 is capable of controlling a second current flow having a second current orientation induced by the second input voltage level until a second predetermined voltage level is obtained across the second current inhibiting element 132 opposing the second current flow. A difference of the second input voltage level and the second predetermined voltage level approximates a second gate voltage potential employed to drive the gate input of the semiconductor device. In one aspect of the present invention, the first and second current inhibiting elements 130, 132 "control" a current flow by substantially inhibiting (blocking) the current flow in an oriented direction until a predetermined voltage level is reached. In other instances of the present invention, the first and second current inhibiting elements 130, 132 allow a current to flow substantially freely in an opposite orientation than a current orientation that they substantially inhibit until the predetermined voltage level is reached.

This is accomplished, in one instance of the present invention, by employing Zener diodes in an opposing fashion to produce the first and second gate voltage potentials. Zener diode breakdown voltages provide the first and second predetermined voltage levels necessary to properly control the gated semiconductor device during gate charge and discharge cycles. In one instance of the present invention, 15 volt Zener diodes are employed for the first and second current inhibiting elements 130, 132.

In the instance of the present invention depicted in FIG. 1, the output control devices 116 (gated semiconductor devices) being driven are power MOSFETs. In other instances of the present invention, the output control devices 116 can include IGBTs and the like. The illustration also shows an opposing pair of Zener diodes employed as the current inhibiting elements 130, 132 in the gate driver circuit 112. In other instances of the present invention, any means having capabilities for inhibiting current flow induced by an input voltage level until a predetermined voltage level is obtained across the means can be utilized in the present invention. This includes, but is not limited to, at least two discrete components and/or a single component possessing the necessary characteristics.

It is helpful to understand the basics of how diodes operate to fully appreciate the present invention. A diode is essentially a two-region device separated by a junction. It either allows current to pass or prohibits it. Whether the current is allowed to pass, is determined by the voltage level and polarity, referred to as biasing. Generally, when the polarity of the applied voltage matches the polarity of the diode region at the junction, the diode is considered to be forward biased, permitting the current to flow. When the polarities are opposing, the diode is considered to be reverse biased, inhibiting the current flow. Current flow in a reverse biased diode can be achieved by raising the applied voltage to a level that forces the junction into breakdown. Generally, reaching this condition in a normal diode will damage it due to the generation of heat caused by the increased current. For Zener-type diodes, however, breakdown is not a damaging condition and the current flow will once again stop when the applied voltage level is reduced below the level required to cause breakdown.

In general, the relationship between the current and voltage can be expressed using the ideal diode equation:

$$I_D = I_S \left( e^{\frac{qV_D}{nkT}} - 1 \right)$$

where $I_D$ is the current through the diode and $V_D$ is the voltage across the diode. Additionally, $I_S$ is the reverse saturation current (the current that flows through the diode when it is reverse biased $-V_D$ is negative), q is the electronic charge ($1.602 \times 10^{-19}$ C), k is Boltzmann's constant ($1.38 \times 10^{-23}$ J/°K), T=junction temperature in Kelvins, and n is the emission coefficient.

Zener diodes are designed to pass a current in the reverse direction when the voltage across it reaches a certain (negative) value, called the Zener voltage ($V_Z$) or "breakdown voltage." For diode voltages $V_D > -V_Z$, the Zener diode behaves like a normal diode, inhibiting the current flow. However, when $V_D = -V_Z$, the diode allows current to flow in the breakdown condition and keeps the voltage $V_D$ nearly constant at the value $-V_Z$. In this way, the Zener diode can act as a voltage regulator.

Turning back to the circuit 100 in FIG. 1, the gate drain resistive elements 114 are typically resistors in an approximate range of 50 k ohms to 150 k ohms. These elements 114 allow a path to drain off a gate charge of a semiconductor device when the gate is not being held to a particular voltage level. This ensures that both transistors are off a short time after a last pulse allowing a high impedance state at an output.

The output control devices 116 include, but are not limited to, such devices as MOSFETs and IGBTs and the like. A gate of the output control device 116 can be utilized to control voltage and/or current between a drain and a source of the output control device 116. In this manner, a small voltage on the gate can control a substantially larger voltage and/or current between the source and the drain. The voltage on the gate can also be switched ON and OFF to control a duty cycle of an output voltage across the drain and the source.

The output filter 118 is optional and is used to filter an output to block any unwanted frequencies from the output. The illustration utilizes an inductor, but any means allowing filtering can be used. In other instances of the present invention, no filtering can also be utilized in the circuit 100.

The gate voltage TP 120 is illustrated to show a point at which measurements can be taken to determine a value for a gate voltage level. Likewise, the output voltage TP 122 illustrates a point at which output voltage levels can be utilized to determine an output voltage level.

Figure 2:
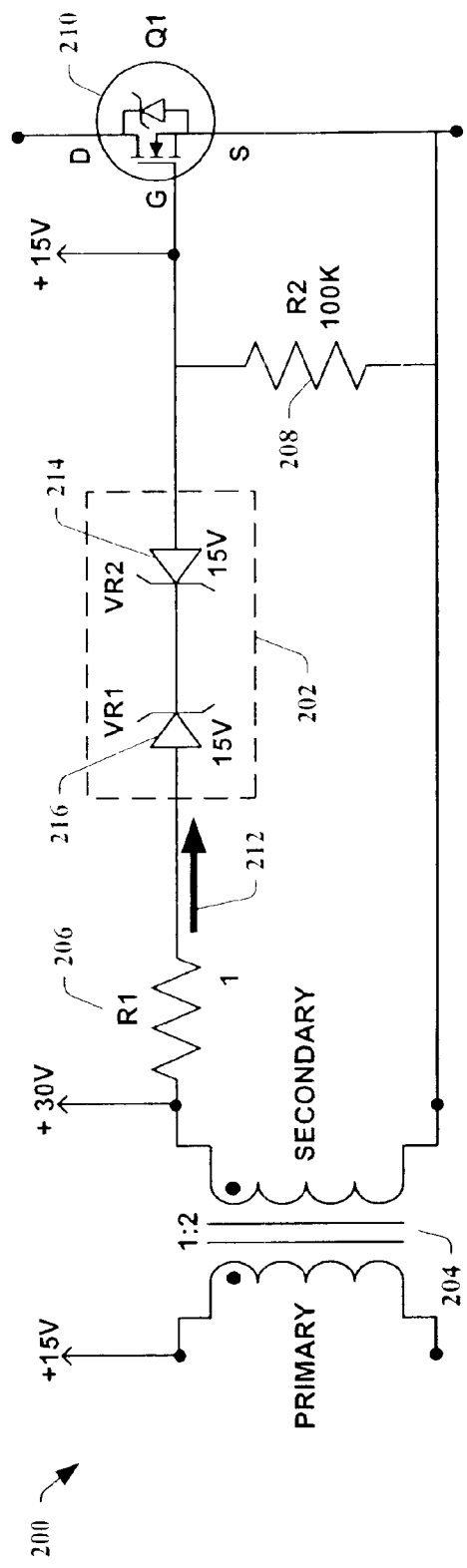
FIG. 2 is a circuit of a gate driver with a positive potential in accordance with an aspect of the present invention.

Turning to FIG. 2, a circuit 200 of a gate driver 202 with a positive potential in accordance with an aspect of the present invention is depicted. In this instance of the present invention, the circuit 200 comprises a 2:1 turns ratio transformer 204, a current limiting element 206, the gate driver 202, a gate drain resistive element 208, and an output control device 210. A voltage of +15 volts is applied across a primary side of the transformer 204. This produces a +30 volt first input voltage level on a secondary side of the transformer 204. A voltage drop across the current limiting element 206 is assumed to be negligible. Therefore, the approximately +30 volts induces a first current 212 with a first current orientation flowing through the gate driver 202. In this instance of the present invention, the first current 212 is blocked by Zener VR2, a first current inhibiting element 214, until its breakdown voltage (first predetermined voltage level) is reached. Zener VR1, a second current inhibiting element 216, allows the first current 212 to substantially pass unaltered. Once the breakdown voltage is reached in a Zener diode, current is allowed to flow and the potential of the Zener diode remains at the breakdown voltage level. In this example, VR2 has a breakdown voltage of 15V. Thus, +15 volts are dropped across Zener VR2, providing a gate of the output control device 210 with an approximate first gate potential of +15 volts (+30 volts minus +15 volts across VR2, excluding any potential drop across the gate drain resistive element 208). An inherent potential drop (typically, approximately 0.7 volts) across Zener VR1 has been excluded also. The positive 15 volts is sufficient to turn ON the output control device 210, ensuring that enough voltage is present to provide predictable operation.

Figure 3:
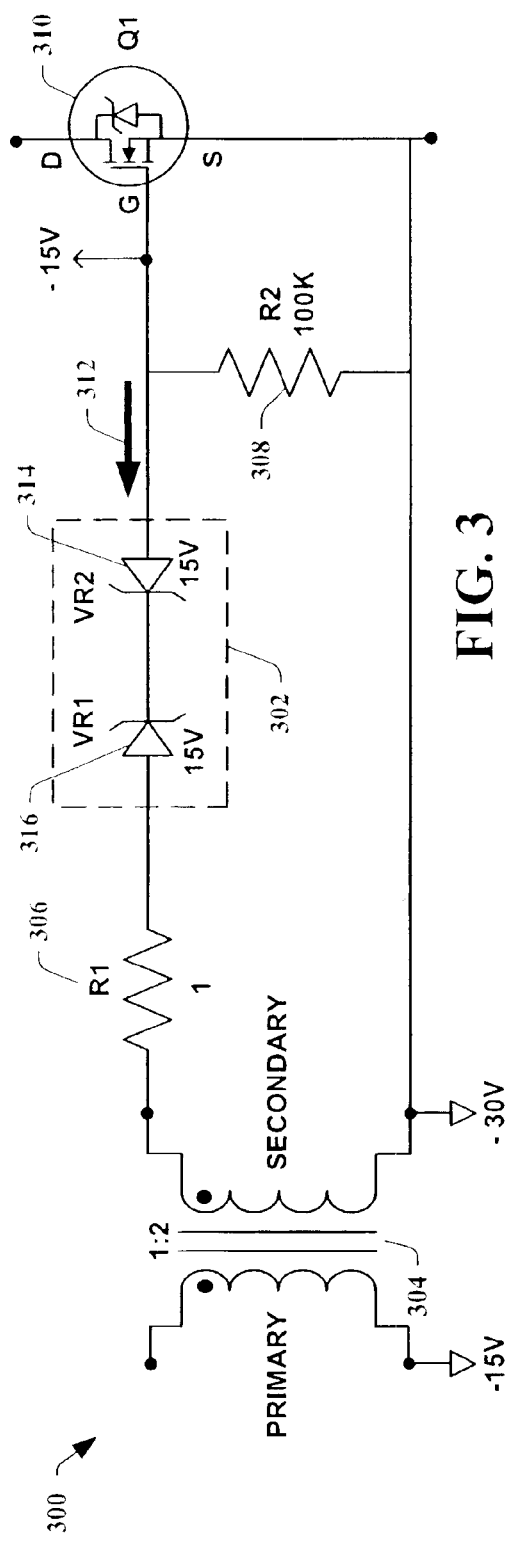
FIG. 3 is a circuit of a gate driver with a negative potential in accordance with an aspect of the present invention.

Turning to FIG. 3, a circuit 300 of a gate driver 302 with a negative potential in accordance with an aspect of the present invention is depicted. In this instance of the present invention, the circuit 300 comprises a 2:1 turns ratio transformer 304, a current limiting element 306, the gate driver 302, a gate drain resistive element 308, and an output control device 310. A voltage of −15 volts is applied across a primary side of the transformer 304. This produces a −30 volt second input voltage level on a secondary side of the transformer 304. A voltage drop across the current limiting element 306 is assumed to be negligible. Therefore, the approximately −30 volts induces a second current 312 with a second orientation flowing through the gate driver 302 in an opposite direction of that found in circuit 200. In this instance of the present invention, the second current 312 is blocked by Zener VR1, a second current inhibiting element 316, until its breakdown voltage (second predetermined voltage level) is reached. Zener VR2, a first current inhibiting element 314, allows the second current 312 to substantially pass unaltered. In this example, VR1 has a breakdown voltage of 15V. Thus, −15 volts are dropped across Zener VR1, providing a second gate potential of the output control device 310 with an approximate potential of −15 volts (−30 volts minus −15 volts across VR1, excluding any potential drop across the gate drain resistive element 308). An inherent potential drop (typically, approximately 0.7 volts) across Zener VR2 has been excluded also. The negative 15 volts is sufficient to turn OFF the output control device 310, ensuring that enough voltage is present to provide predictable operation. This is particularly important in radiation environments where a gate turn ON voltage diminishes under exposure, sometimes down to zero volts. Thus, it is important, to ensure the gate is truly turned OFF, to provide a definitive negative voltage level that provides predictable performance.

Figure 4:
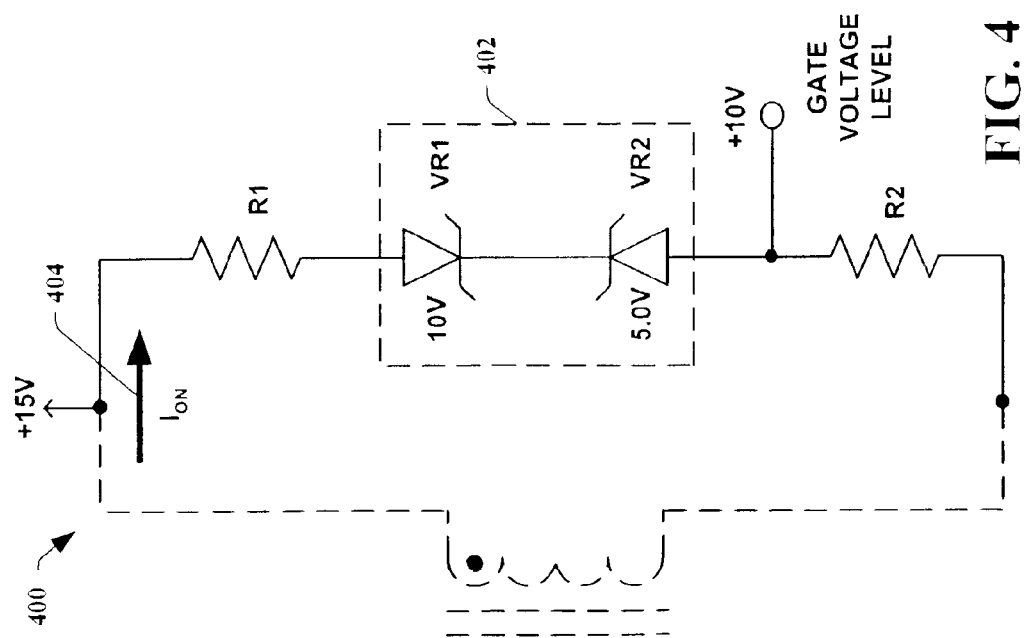
FIG. 4 is another circuit of a gate driver with a positive potential in accordance with an aspect of the present invention.

Referring to FIG. 4, another circuit 400 of a gate driver 402 with a positive potential in accordance with an aspect of the present invention is shown. This circuit 400 illustrates the flexibility of the present invention. In this instance of the present invention, the gate driver 402 comprises a 10 volt Zener, VR1, and a 5.0 volt Zener, VR2. In other instances of the present invention, the Zener diode breakdown voltage values utilized in the gate driver 402 can be any value that is needed to provide sufficient levels of voltage potential to operate a gated semiconductor device in a desired fashion. In this example, a positive 15 volt input voltage is provided that produces a current 404, $I_{ON}$. VR2 allows the current 404 to flow once VR2's potential reaches its breakdown voltage. Again, excluding negligible element voltage drops (VR1, R1, R2, etc.), a drop of +5 volts across VR2 produces a gate voltage level of +10 volts.

Figure 5:
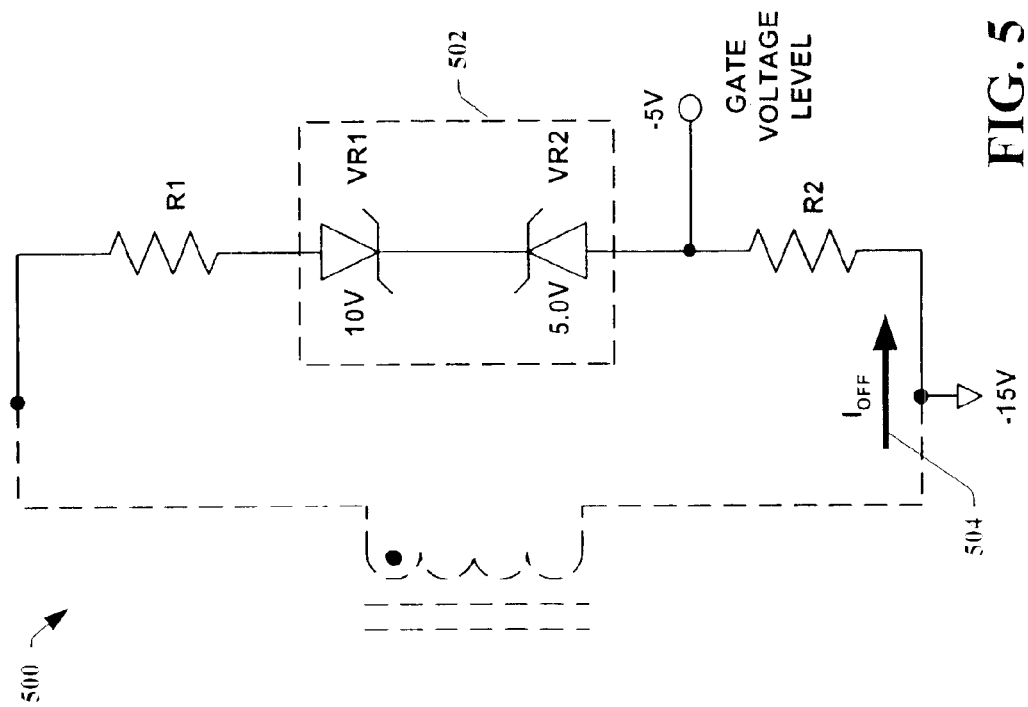
FIG. 5 is another circuit of a gate driver with a negative potential in accordance with an aspect of the present invention.

Referring to FIG. 5, another circuit 500 of a gate driver 502 with a negative potential in accordance with an aspect of the present invention is shown. This circuit 500, along with circuit 400 supra, further illustrates the flexibility of the present invention. In this instance of the present invention, the gate driver 502 again comprises a 10 volt Zener, VR1, and a 5.0 volt Zener, VR2. In this example, a negative 15 volt input voltage is provided that produces a current 504, $I_{OFF}$. VR1 allows the current 504 to flow once VR1's potential reaches its breakdown voltage. Again, excluding negligible element voltage drops (VR2, R1, R2, etc.), a drop of −10 volts across VR1 produces a gate voltage level of −5 volts.

Figure 6:
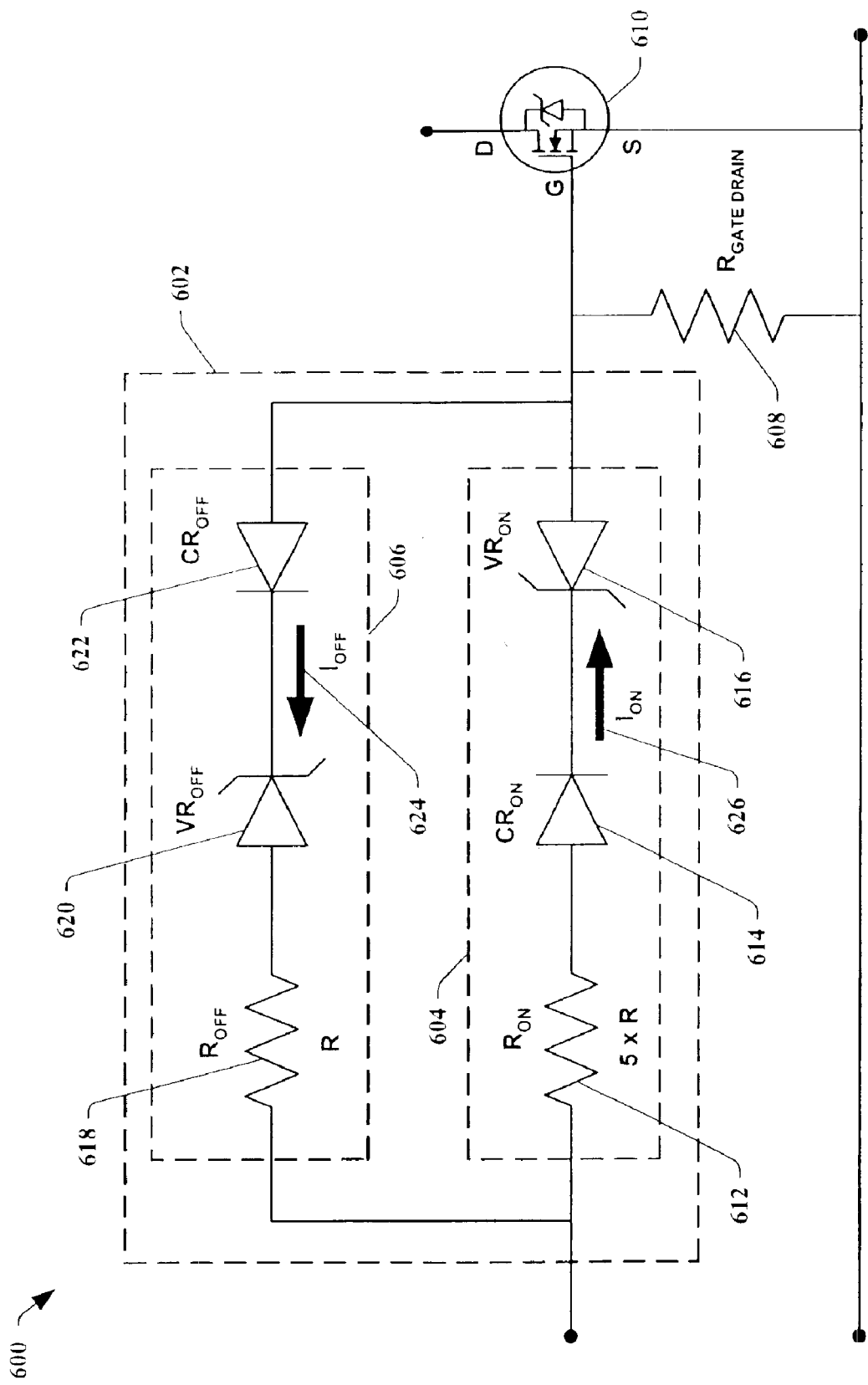
FIG. 6 is another circuit of a gate driver in accordance with an aspect of the present invention.

Looking at FIG. 6, another circuit 600 of a gate driver 602 in accordance with an aspect of the present invention is shown. This illustration once again demonstrates the flexibility allowed by the present invention in controlling a gated semiconductor device. The circuit 600 is comprised of the gate driver 602, a gate drain resistive element 608 and a gated semiconductor device 610. The gate driver 602, in this instance of the present invention, is comprised of a first gate function circuit 604 and a second gate function circuit 606. The first gate function circuit 604 can include such functions as turning the gate ON and the like. The second gate function circuit 606 can include such functions as turning the gate OFF and the like. In this example of one instance of the present invention, the first gate function circuit 604 turns the gate ON and the second gate function circuit 606 turns the gate OFF. The first and second gate function circuits 604, 606 include any means having a capability for inhibiting current flow induced by an input voltage level until a predetermined voltage level is obtained across the means. This includes, but is not limited to, at least two discrete components and/or a single component possessing the necessary characteristics. FIG. 6 illustrates an example of one instance of the present invention where the first gate function circuit 604 is comprised of a first asymmetric current inhibitor 614, $CR_{ON}$; a first current inhibiting element 616, $VR_{ON}$; and a first current limiting element 612, $R_{ON}$; and the second gate function circuit 606 is comprised of a second asymmetric current inhibitor 622, $CR_{OFF}$; a second current inhibiting element 620, $VR_{OFF}$; and a second current limiting element 618, $R_{OFF}$.

The first and second asymmetric current inhibitors 614, 622 determine which circuit is active based on a direction of a current in the circuit 600. They substantially inhibit (block) a current in one direction only. The current flows substantially freely in an opposite direction. Typically, the first and second asymmetric current inhibitors 614, 622 are oriented in an opposing fashion relative to an oriented current to channel a desired current flow into a desired gate function circuit. In one instance of the present invention, the asymmetric current inhibitors 614, 622 are diodes, but any means sufficient to control turning on a gate function circuit can be employed in the present invention (e.g., switch, relay, transistor, etc.). In the example illustrated, a first current 626, $I_{ON}$, represents a first current orientation associated with turning ON the gated semiconductor device 610. Likewise, a second current 624, $I_{OFF}$, represents a second current orientation associated with turning OFF the gated semiconductor device 610. The first and second current inhibiting elements 616, 620 perform a similar function as described supra in previous examples. Inclusion of first and second current limiting elements 612, 618 provide a means to separately regulate timing of charging and discharging of the gate. This reduces shoot-through on an output of the gated semiconductor device 610. Generally, it is advantageous to charge more slowly than discharging. A typical charge period can be approximately five times as long as a discharge period. To accomplish this, $R_{ON}$, the first current limiting element 612, is typically approximately five times a value of $R_{OFF}$, the second current limiting element 618. In other instances of the present invention, other means besides resistors can be utilized to achieve longer and/or shorter periods of gate charging and discharging. In other instances of the present invention, other multipliers can be employed to establish current limiting values for differing charging and discharging rates.

Operationally, when an $I_{ON}$ current 626 is induced in the circuit 600, $CR_{OFF}$ blocks $I_{ON}$ from flowing through the second function circuit 606. Thus, the first function circuit 604 controls the charging of the gate via a gate voltage established by a voltage drop across $VR_{ON}$. As noted before, $R_{ON}$ controls the timing of the gate charging. Likewise, when an $I_{OFF}$ current 624 is induced in the circuit 600, $CR_{ON}$ blocks $I_{OFF}$ from flowing through the first function circuit 604. Thus, the second function circuit 606 controls the discharging of the gate via a gate voltage established by a voltage drop across $VR_{OFF}$. As noted before, $R_{OFF}$ controls the timing of the gate discharging.

Figure 7:
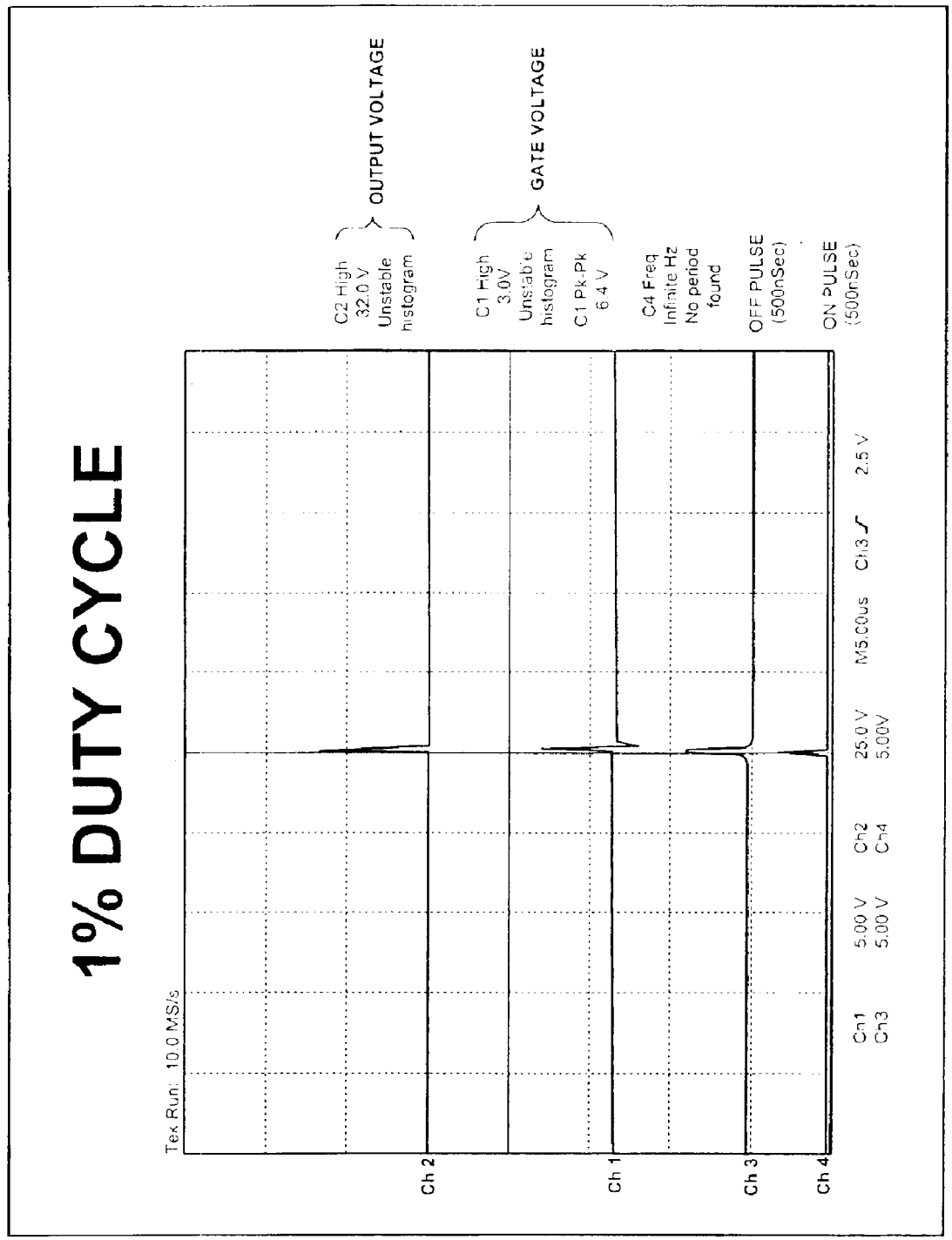
FIG. 7 is a symbolic graph depicting relative voltage levels in accordance with the present invention.

Turning to FIG. 7, a symbolic graph 700 depicting relative voltage levels in accordance with the present invention is shown. A 1% "ON" time or duty cycle is illustrated for an output voltage at a test point (TP) denoted in FIG. 1 as output voltage TP 122. A gate voltage, denoted in FIG. 1 as gate voltage TP 120, is also illustrated for the cycle. The gate voltage includes peak voltage and peak-to-peak voltage levels. An ON pulse of 500 nsec was utilized to trigger the rise of the cycle, and a 500 nsec OFF pulse was utilized to trigger the fall of the cycle. These pulses were input at points illustrated in FIG. 1 for the FET driver 102 and are denoted as "ON PULSE" and "OFF PULSE", pins 12 and 14 respectively. The output voltage peaked at 32.0 volts with a gate voltage of 3.0 volts during the ON cycle.

Figure 8:
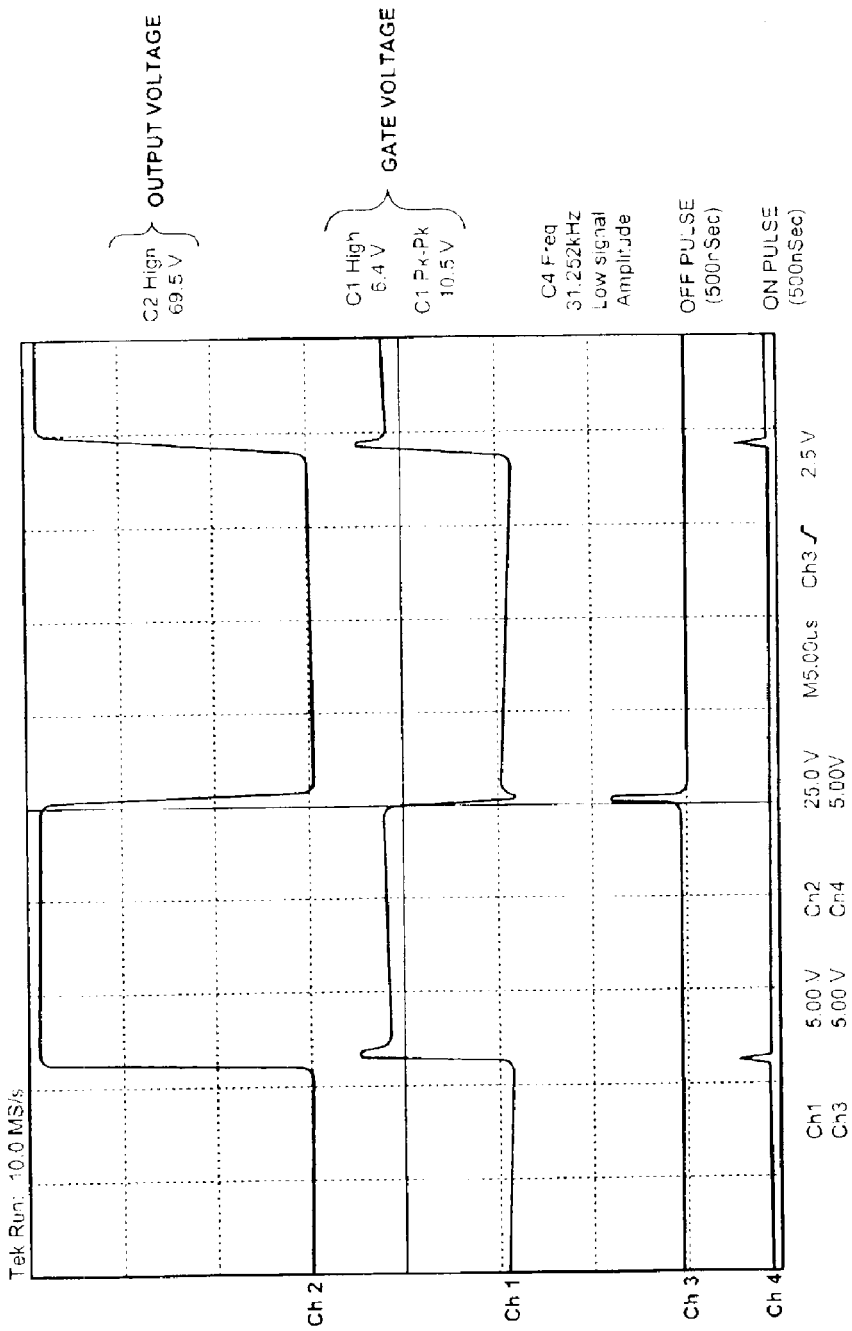
FIG. 8 is another symbolic graph depicting voltage levels in accordance with the present invention.

In FIG. 8, another symbolic graph 800 depicting voltage levels in accordance with the present invention is shown. A 40% "ON" time or duty cycle is illustrated for an output voltage at a TP denoted in FIG. 1 as output voltage TP 122. A gate voltage, denoted in FIG. 1 as gate voltage TP 120, is also illustrated for the cycle. The gate voltage includes peak voltage and peak-to-peak voltage levels. An ON pulse of 500 nsec was utilized to trigger the rise of the cycle and a 500 nsec OFF pulse was utilized to trigger the fall of the cycle. These pulses were input at points illustrated in FIG. 1 for the FET driver 102 and are denoted as "ON PULSE" and "OFF PULSE", pins 12 and 14 respectively. The output voltage peaked at 69.5 volts with a gate voltage of 6.4 volts during the ON cycle.

Figure 9:
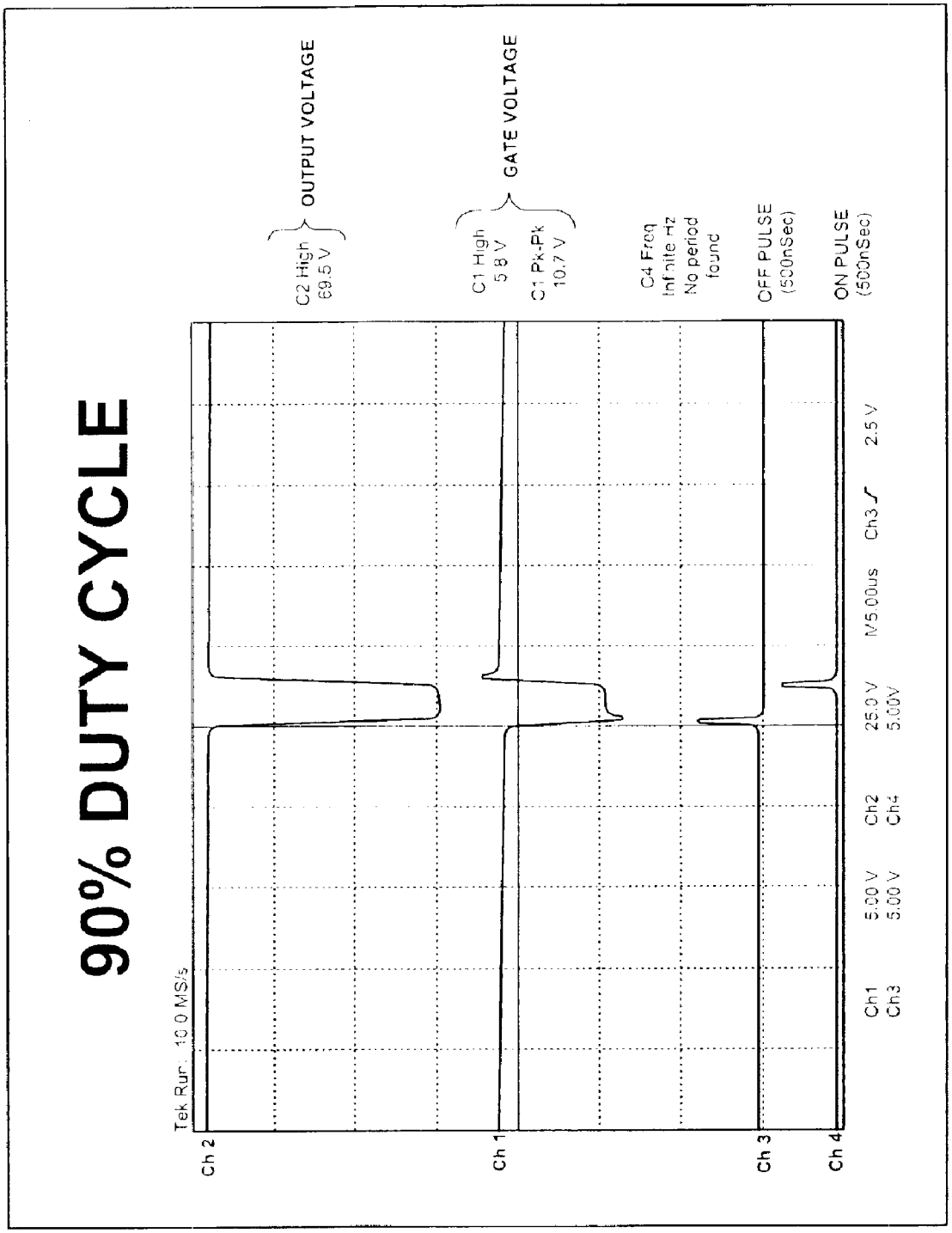
FIG. 9 is yet another symbolic graph depicting voltage levels in accordance with the present invention.

Looking at FIG. 9, yet another symbolic graph 900 depicting voltage levels in accordance with the present invention is shown. A 90% "ON" time or duty cycle is illustrated for an output voltage at a TP denoted in FIG. 1 as output voltage TP 122. A gate voltage, denoted in FIG. 1 as gate voltage TP 120, is also illustrated for the cycle. The gate voltage includes peak voltage and peak-to-peak voltage levels. An ON pulse of 500 nsec was utilized to trigger the rise of the cycle and a 500 nsec OFF pulse was utilized to trigger the fall of the cycle. These pulses were input at points illustrated in FIG. 1 for the FET driver 102 and are denoted as "ON PULSE" and "OFF PULSE", pins 12 and 14 respectively. Again, an output voltage of 69.5 volts is maintained with a gate voltage of 5.8 volts during the ON cycle.

Figure 10:
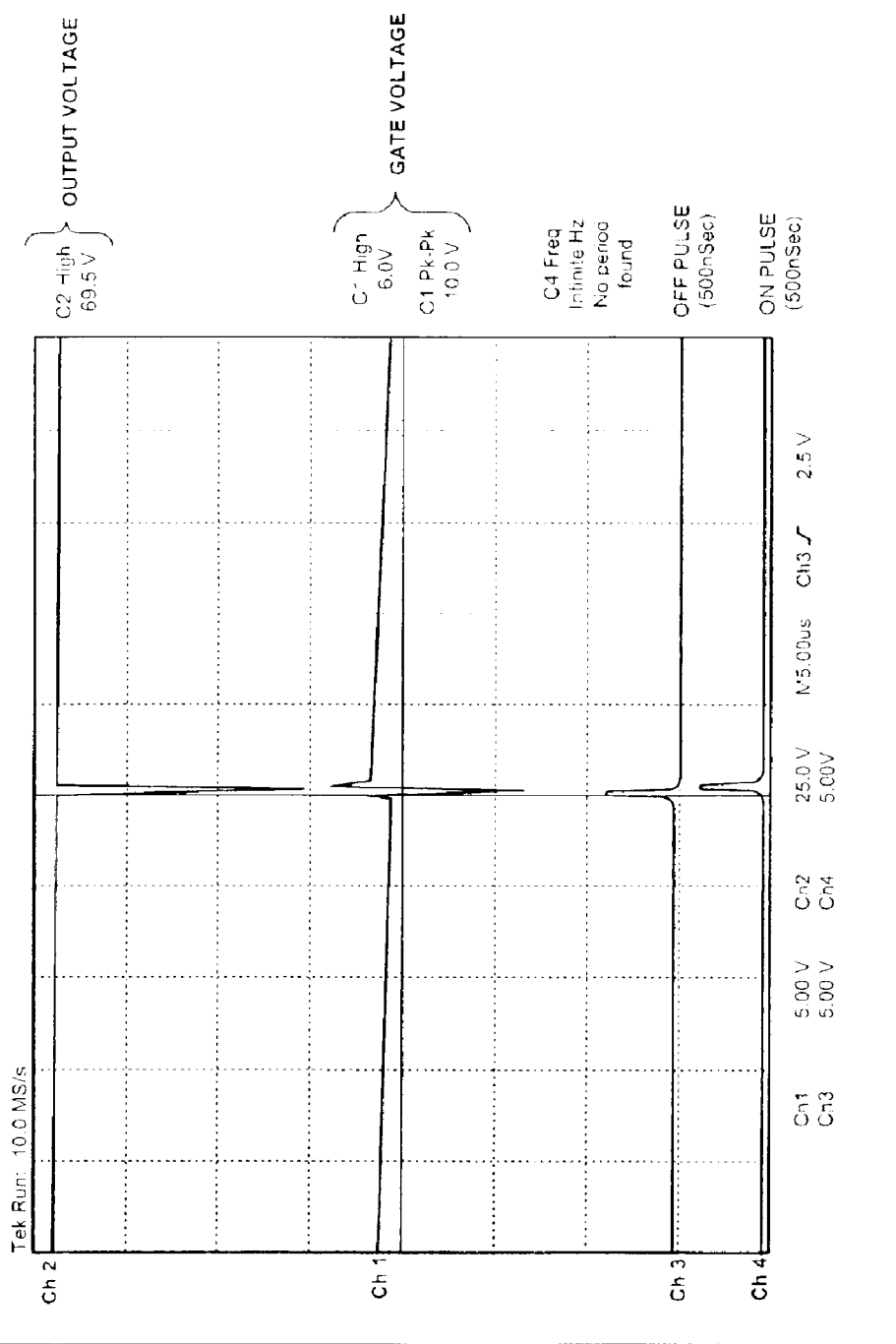
FIG. 10 is still yet another symbolic graph depicting voltage levels in accordance with the present invention.

Referring to FIG. 10, still yet another symbolic graph 1000 depicting voltage levels in accordance with the present invention is shown. A 99% "ON" time or duty cycle is illustrated for an output voltage at a TP denoted in FIG. 1 as output voltage TP 122. A gate voltage, denoted in FIG. 1 as gate voltage TP 120, is also illustrated for the cycle. The gate voltage includes peak voltage and peak-to-peak voltage levels. An ON pulse of 500 nsec was utilized to trigger the rise of the cycle and a 500 nsec OFF pulse was utilized to trigger the fall of the cycle. These pulses were input at points illustrated in FIG. 1 for the FET driver 102 and are denoted as "ON PULSE" and "OFF PULSE", pins 12 and 14 respectively. Unachievable with typical transistor based gate drivers, the present invention depicts a 99% duty cycle. The output voltage level is maintained at 69.5 volts with a gate voltage of 6.0 volts during the ON cycle.

One skilled in the art can appreciate that various average output voltages can be achieved by altering duty cycles. However, typically, it is desirable, for the sake of efficiency, to produce a 100% duty cycle. Thus, the present invention is more efficient than typical complex transistor based gate drivers that can only achieve between 90 to 95% at best.

Furthermore, the present invention is useful in many suitable devices requiring isolated semiconductor device drivers. For example, the present invention is useful in computer controlled devices, industrial equipment, robotics, satellite/space equipment, medical equipment, research and development equipment, motor drive controls, satellite gimbal control systems, radiation environments, and the like.

Figure 11:
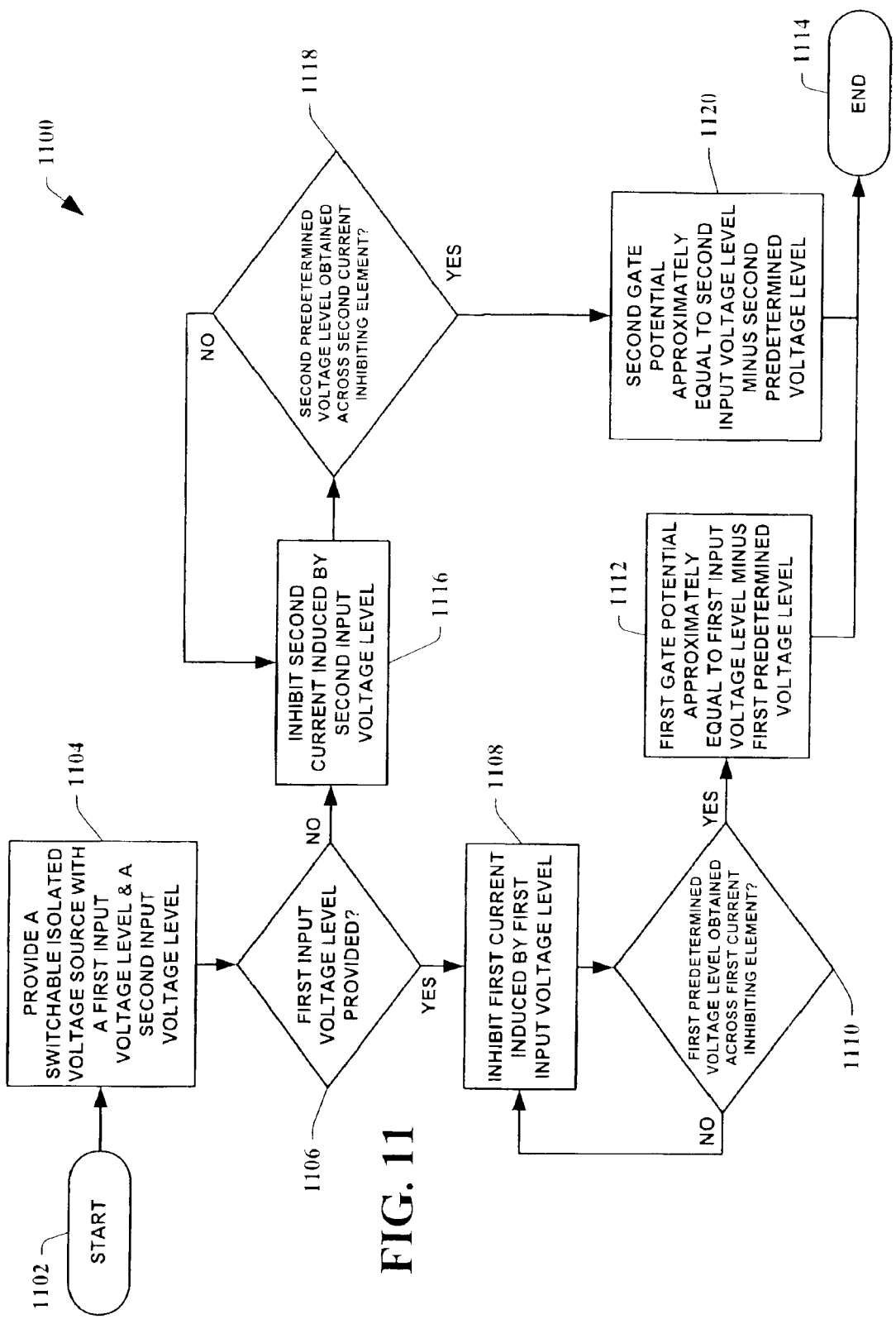
FIG. 11 is a flow diagram of a method of obtaining a gate potential of a semiconductor device in accordance with an aspect of the present invention.

In view of the exemplary systems shown and described above, methodologies, which may be implemented in accordance with one or more aspects of the present invention, will be better appreciated with reference to the flow diagram of FIG. 11. While, for purposes of simplicity of explanation, the methodology is shown and described as a series of function blocks, it is to be understood and appreciated that the present invention is not limited by the order of the blocks, as some blocks may, in accordance with the present invention, occur in different orders and/or concurrently with other blocks from that shown and described herein.

Moreover, not all illustrated blocks may be required to implement a methodology in accordance with one or more aspects of the present invention. It is to be appreciated that the various blocks may be implemented via software, hardware a combination thereof or any other suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

In FIG. 11, a flow diagram of a method 1100 of obtaining a gate potential of a semiconductor device in accordance with an aspect of the present invention is depicted. The method 1100 starts 1102 with providing a switchable isolated voltage source with a first input voltage level and a second input voltage level 1104. The switchable isolated voltage source is capable of creating the first input voltage level with a first input orientation and the second input voltage level with a second input orientation. Generally speaking, this entails providing a positive voltage level and switching to a negative voltage level to change the orientation. Typically, the first and second input voltage levels are, in absolute terms, approximately identical (+/- of the same value). However, they can be differing values if desired. In one aspect of the present invention, the switchable isolated voltage source is comprised of an isolation transformer with a primary winding side electrically connected to a FET driver and a secondary winding side electrically connected to provide the first and second input voltage levels.

A determination is then made as to whether a first input voltage level is being provided 1106. If the first input voltage level is provided, a first current with a first current orientation induced by the first input voltage level is inhibited 1108. A determination is then made as to whether a first predetermined voltage level across a first current inhibiting element has been obtained 1110. The first predetermined voltage level is chosen by design to implement a given gate potential desired in a particular circumstance. Often, the first predetermined voltage level is chosen to coincide with a value necessary to turn the semiconductor device ON. Typically, this determination is provided by the first inhibiting element itself. A first Zener diode can be utilized as the first inhibiting element. The first Zener diode blocks the first current until its breakdown voltage is reached, allowing the first current to flow. The breakdown voltage, in this example, provides the first predetermined voltage level. Once the first predetermined voltage level has been met 1110, a first gate potential of the semiconductor device is produced that is approximately equal to the first input voltage level minus the first predetermined voltage level 1112, ending the flow 1114. The exact value must additionally account for parasitic losses, any resistive elements utilized in a circuit, and diodic junction losses and the like. If the first predetermined voltage level has not been obtained 1110, the first current is inhibited 1108 until the first predetermined voltage level has been obtained.

If the first input voltage level is not provided 1106, an assumption is made that the second input voltage level is then provided. A second current with a second current orientation induced by the second input voltage level is then inhibited 1116. A determination is then made as to whether a second predetermined voltage level across a second current inhibiting element has been obtained 1118. The second predetermined voltage level is chosen by design to implement a given gate potential desired in a particular circumstance. Often, the second predetermined voltage level is chosen to coincide with a value necessary to turn the semiconductor device OFF. Typically, this determination is provided by the second inhibiting element itself. A second Zener diode can be utilized as the second inhibiting element.

The second Zener diode blocks current until its breakdown voltage is reached, allowing the second current to flow. The breakdown voltage, in this example, provides the second predetermined voltage level. Once the second predetermined voltage level has been met 1118, a second gate potential of the semiconductor device is produced that is approximately equal to the second input voltage level minus the second predetermined voltage level 1120, ending the flow 1114. The exact value must additionally account for parasitic losses, any resistive elements utilized in a circuit, and diodic junction losses and the like. If the second predetermined voltage level has not been obtained 1110, the second current is inhibited 1108 until the second predetermined voltage level has been obtained.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A system for driving a gate of a semiconductor device, comprising:
    a switchable isolated voltage source providing a first input voltage level with a first input orientation and a second input voltage level with a second input orientation;
    a first current inhibiting element capable of inhibiting a first current flow having a first current orientation induced by the first input voltage level until a first predetermined voltage level is obtained across the first current inhibiting element;
    a first gate potential approximately equal to the first input voltage level minus the first predetermined voltage level;
    a second current inhibiting element capable of inhibiting a second current flow having a second current orientation, induced by the second input voltage level, until a second predetermined voltage level is obtained across a second current inhibiting element;
    a second gate potential approximately equal to the second input voltage level minus the second predetermined voltage level; and
    at least one of:
        a first asymmetric current inhibitor for flowing only a gate charge current, and
        a second asymmetric current inhibitor for flowing only a gate discharge current.

2. The system of claim 1, the switchable isolated voltage source additionally having a capability to accommodate a current up to approximately 2 amps.

3. The system of claim 1, the switchable isolated voltage source comprising:
    a PET driver; and
    an isolation transformer electrically connected to the FET driver on a primary winding side and electrically connected to provide the first and second input voltage levels on a secondary winding side.

4. The system of claim 3, the isolation transformer having a volt-second rating of less than approximately 15 $\mu V*S$ for a primary winding input voltage in a range of approximately 5 to 20 volts.

5. The system of claim 3, the isolation transformer having a secondary to primary winding ratio of approximately 2:1.

6. The system of claim 3, further comprising a transformer core desaturation circuit electrically connected between the FET driver and the primary winding side of the isolation transformer.

7. The system of claim 6, the transformer core desaturation circuit comprising at least one from the group consisting of at least one diode, at least one pair of back-to-back diodes, and at least one Zener diode.

8. The system of claim 1, the first and second asymmetric current inhibitors comprising diodes.

9. The system of claim 1, the first and second current inhibiting elements comprising first and second Zener diodes in an electrically opposed orientation.

10. The system of claim 9, at least one of the first and second Zener diodes having a breakdown voltage of approximately 15 volts.

11. The system of claim 1, further comprising at least one selected from the group consisting of a first current limiting element providing current limiting of a first current utilized to charge a gate and a second current limiting element providing current limiting of a second current utilized to discharge a gate.

12. The system of claim 11, the first and second current limiting elements comprising resistors.

13. The system of claim 11, the first current limiting element having a current limiting value approximately five times a current limiting value of the second current limiting element.

14. A device for driving a gate, comprising:
    a FET driver;
    an isolation transformer having a primary winding side electrically connected to the FET driver;
    a first diode having a first diode anode end and a first diode cathode end, the first diode anode end electrically connected to the isolation transformer for passing current during a gate charge cycle;
    a first Zener diode having a first Zener diode anode end and a first Zener diode cathode end, the first Zener diode cathode end electrically connected to the first diode cathode end and the first Zener diode anode end electrically connected to the gate;
    a second Zener diode having a second Zener diode anode end and a second Zener diode cathode end, the second Zener diode anode end electrically connected to the first diode anode end and the isolation transformer; and
    a second diode having a second diode anode end and a second diode cathode end, the second diode cathode end electrically connected to the second Zener diode cathode end and the second diode anode end electrically connected to the first Zener diode anode end and the gate for passing current during a gate discharge cycle.

15. The device of claim 14, further comprising a resistor electrically connected between the gate and a source of a gated semiconductor device for draining a gate potential.

16. The device of claim 14, further comprising:
    a first resistor electrically connected in series with the first diode and the first Zener diode for limiting current during a gate charge cycle; and a second resistor electrically connected in series with the second diode and the second Zener diode for limiting current during a gate discharge cycle.

17. The device of claim 16, the first resistor having a resistive value of approximately five times a value of the second resistor.

18. A method of obtaining a gate potential of a semiconductor device, comprising:

providing a switchable isolated voltage source capable of creating a first input voltage level with a first input orientation and a second input voltage level with a second input orientation;

inhibiting a first current flow having a first current orientation induced by the first input voltage level via a first asymmetric current inhibitor until a first predetermined voltage level is obtained across a first current inhibiting element, creating a first gate potential approximately equal to the first input voltage level minus the first predetermined voltage level, the first gate potential charge a gate of the semiconductor device; and inhibiting a second current flow having a second current orientation, induced by the second input voltage level, via a second asymmetric current inhibitor until a second predetermined voltage level is obtained across a second current inhibiting element, creating a second gate potential approximately equal to the second input voltage level minus the second predetermined voltage level, the second gate potential discharge the gate of the semiconductor device.

19. The method of claim 18, further comprising providing a 100% duty cycle for an output.

20. The method of claim 18, wherein the switchable isolated voltage source comprising:

a FET driver; and an isolation transformer electrically connected to the FET driver on a primary winding side and electrically connected to provide the first and second input voltage levels on a secondary winding side.

21. The method of claim 18, wherein the first and second current inhibiting elements comprising first and second Zener diodes in an electrically opposed orientation.

22. The method of claim 21, further including maintaining at least one of the first and second gate potentials via at least one of the first and second Zener diodes during current flow reversals.

23. The method of claim 18, further including at least one selected from the group consisting of controlling the gate charging period with a first current limiting element and controlling the gate discharging period with a second current limiting element.

24. The method of claim 23, wherein the first and second current limiting elements comprising resistors.

25. The method of claim 23, wherein the gate charging period is approximately five times the gate discharging period.

* * * * *